(12) United States Patent
Chen et al.

(10) Patent No.: US 11,539,824 B2
(45) Date of Patent: Dec. 27, 2022

(54) SPLIT MOBILE PHONE RADIATOR

(71) Applicant: SHENZHEN SEA STAR SOUNDS CO., LTD, Shenzhen (CN)

(72) Inventors: Chunyu Chen, Shenzhen (CN); Xianxu Li, Shenzhen (CN); Zhengjun Qiu, Lianyuan (CN)

( * ) Notice: Subject to any disclaimer, the term of this patent is extended or adjusted under 35 U.S.C. 154(b) by 0 days.

(21) Appl. No.: 17/447,939

(22) Filed: Sep. 17, 2021

(65) Prior Publication Data

US 2022/0006891 A1 Jan. 6, 2022

(30) Foreign Application Priority Data

Aug. 25, 2021 (CN) .......................... 202122010368.4

(51) Int. Cl.
*H04B 1/06* (2006.01)
*H04M 1/21* (2006.01)
*H04B 1/3888* (2015.01)
*H01L 23/38* (2006.01)

(52) U.S. Cl.
CPC .............. *H04M 1/21* (2013.01); *H01L 23/38* (2013.01); *H04B 1/3888* (2013.01)

(58) Field of Classification Search
CPC ...................... H04B 1/3888; H04M 1/724094; H04M 1/21; H04M 1/026; H04M 1/185
See application file for complete search history.

(56) References Cited

U.S. PATENT DOCUMENTS

| | | | |
|---|---|---|---|
| 8,089,753 B2 * | 1/2012 | Dotson | A45C 11/00 361/679.48 |
| 9,479,212 B1 * | 10/2016 | Garcia | G06F 1/189 |
| 2010/0084122 A1 | 4/2010 | Chan | |
| 2013/0201628 A1 | 8/2013 | Aoki et al. | |
| 2014/0060463 A1 | 3/2014 | Faulkner et al. | |
| 2015/0036291 A1 * | 2/2015 | Yuan | G06F 1/203 361/690 |

* cited by examiner

*Primary Examiner* — Tuan Pham
(74) *Attorney, Agent, or Firm* — Rumit Ranjit Kanakia

(57) ABSTRACT

The present disclosure discloses a split mobile phone radiator. The split mobile phone radiator includes a protective cover. An accommodating groove is formed in the top of the inner wall of the protective cover. A refrigeration module is separably arranged on the top surface, far away from the accommodating groove, of the protective cover. The refrigeration module includes a semiconductor refrigeration mechanism, a radiating mechanism used for cooling the semiconductor refrigeration mechanism, and a rear cover wrapping around the semiconductor refrigeration mechanism and the radiating mechanism. A heat conducting silica gel sheet is arranged on one side, close to the protective cover, of the rear cover. According to the present disclosure, the whole refrigeration module fits the top of the protective cover, so that the mobile phone radiator is directly attached to the back side of the mobile phone, and the mobile phone radiator has a split function.

11 Claims, 3 Drawing Sheets

SPLIT MOBILE PHONE RADIATOR

TECHNICAL FIELD

The present disclosure relates to the technical field of mobile phone radiators, and in particular, to a split mobile phone radiator.

BACKGROUND

A mobile phone radiator is an external fan device which directly blows air against the back of a mobile phone, increases the air circulation of the back of the mobile phone, and introduces relatively low-temperature air, so that all heating elements inside the mobile phone can be radiated. The radiating efficiency of the mobile phone can be increased by increasing the air flow velocity around the mobile phone, and the cooling of the mobile phone can be assisted, so that normal operation of the mobile phone can be guaranteed, and the crash caused by over-high temperature of the mobile phone can be avoided. However, the radiating efficiency is not high.

At present, the existing mobile phone radiator is generally separated from the mobile phone by a certain distance and can be directly placed on the back side of the mobile phone. Even if it can be placed on the back side of the mobile phone, it does not have a good split function, that is, it does not have a good detachable function. Therefore, it is urgent to design a split mobile phone radiator with high radiating efficiency to solve the above-mentioned problems.

SUMMARY

An objective of the present disclosure is to provide a split mobile phone radiator to solve the disadvantages in the prior art.

To achieve the above-mentioned objective, the present disclosure adopts the following technical solutions:

A split mobile phone radiator includes a protective cover. An accommodating groove is formed in the top of the inner wall of the protective cover. A refrigeration module is separably arranged on the top surface, far away from the accommodating groove, of the protective cover. The refrigeration module includes a semiconductor refrigeration mechanism, a radiating mechanism used for cooling the semiconductor refrigeration mechanism, and a rear cover wrapping around the semiconductor refrigeration mechanism and the radiating mechanism. A heat conducting silica gel sheet is arranged on one side, close to the protective cover, of the rear cover.

Preferably, first ventilation openings that are distributed at equal distance are formed in the top of the rear cover, and second ventilation openings that are distributed at equal distance are formed between an outer wall and an inner wall of the circumference of the rear cover.

Preferably, the semiconductor refrigeration mechanism includes a semiconductor refrigeration sheet and a control circuit board. A through hole for the semiconductor refrigeration sheet to penetrate through is formed in the control circuit board. The control circuit board internally includes a control circuit for driving the semiconductor refrigeration sheet. The semiconductor refrigeration sheet is electrically connected to the control circuit board.

Preferably, the radiating mechanism includes a radiating sheet and a plurality of radiating fins that are distributed annularly. One side surface of the radiating sheet is connected to the plurality of radiating fins, and the other side surface of the radiating sheet is tightly attached to a heating surface of the semiconductor refrigeration sheet. A fan is arranged on the inner side of a ring of the plurality of radiating fins. The control circuit board further includes a driving circuit used for driving the fan. The fan is electrically connected to the control circuit board. The surface of the radiating mechanism is coated with a radiating coating.

Preferably, a heat conducting sheet is arranged in the accommodating groove.

Preferably, a through hole adapted to the refrigeration module is formed in one side, far away from the accommodating groove, of the protective cover.

Preferably, the protective cover is made of a heat conducting material, which includes, but is not limited to, a heat conducting metal and a heat conducting polymer.

Preferably, the refrigeration module is fixed to the protective cover by using bonding force, and a bonding layer is arranged between the rear cover and the protective cover.

Preferably, the refrigeration module is fixed to the protective cover in a buckling manner, and a buckle structure is arranged between the bottom of the rear cover and the top of the protective cover.

Preferably, the refrigeration module is fixed to the protective cover by using magnetic attraction force. A first magnetic ring is arranged at the bottom of an inner wall of the rear cover. If there is no magnetic ring in a mobile phone, a second magnetic ring that attracts the first magnetic ring mutually is embedded into the protective cover.

Preferably, the refrigeration module is fixed to the protective cover by using magnetic attraction force. A first magnetic ring is arranged at the bottom of an inner wall of the rear cover. If there is a magnetic ring in a mobile phone, the magnetic ring in the mobile phone attracts the first magnetic ring mutually.

The present disclosure has the following beneficial effects:

1. The mobile phone is tightly clamped inside the protective cover through the protective cover, the heat conducting sheet, a camera hole, an audio hole position, a charging hole position, and the refrigeration module, so that parts on the mobile phone are clamped inside the camera hole, the audio hole position, the charging hole position, etc. A separable effect between the refrigeration module and the protective cover can be achieved in a bonding manner, which does not affects a complete appearance of the protective cover. A hole does not need to be formed in the back surface of the protective cover for conducting heat, so that the whole mobile phone radiator is directly attached to the back side of the mobile phone, has a good separable function, and a good detachable function.

2. Through the arranged heat conducting sheet, the heat conducting silica gel sheet, the semiconductor refrigeration mechanism, the radiating mechanism, the rear cover, the radiating coating, the fan, and the heat conducting coating, the heat conducting sheet fits the mobile phone with a certain pressure, which facilitates heat conducting of a heating part of the mobile phone and the heat conducting sheet. The heat conducting silica gel sheet and the heat conducting sheet are cooled through the refrigerating surface of the semiconductor refrigeration mechanism, so as to reduce the temperature of the mobile phone. In addition, the heating surface of the semiconductor refrigeration sheet is radiated through the radiator, which can effectively discharge the heat of the semiconductor refrigeration sheet from the back of the mobile phone, so that the radiating function of the whole split mobile phone radiator is realized.

Figure 1:
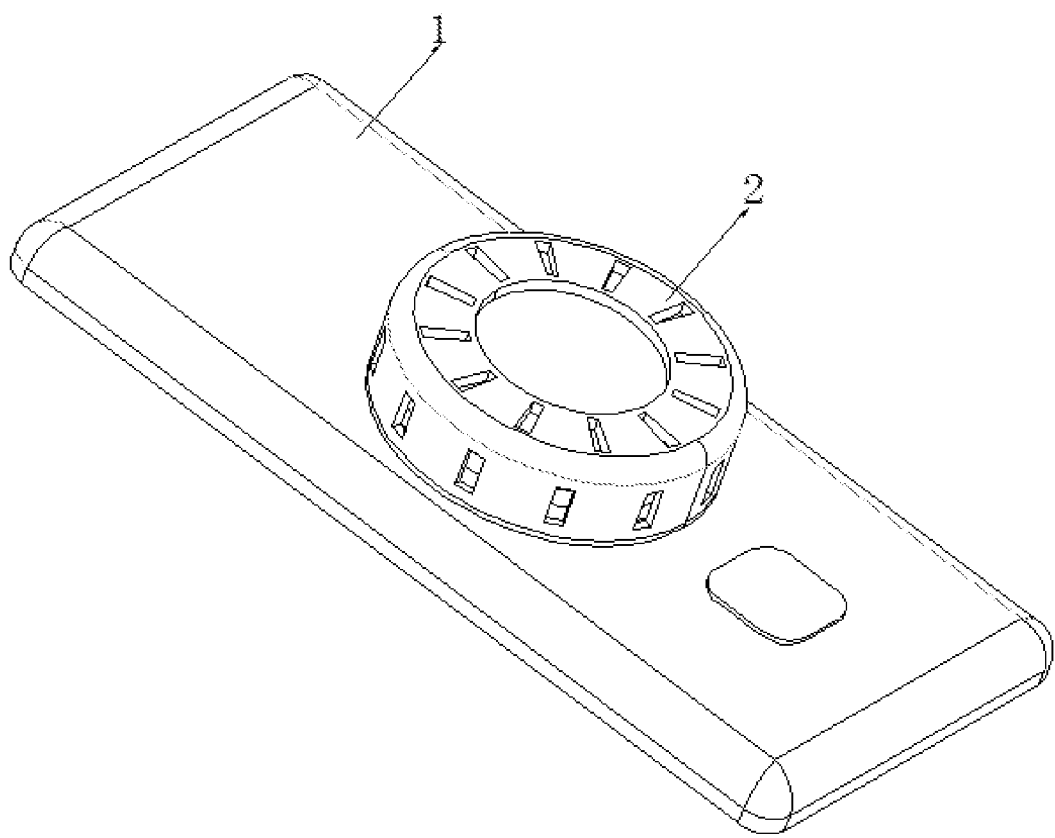
FIG. 1 is a schematic structural diagram of a front section view of a split mobile phone radiator provided by the present disclosure.

Reference signs in the drawings: 1—protective cover; 2—refrigeration module; 3—first magnetic ring; 4—second magnetic ring; 5—heat conducting sheet; 6—rear cover; 7—first ventilation opening; 8—second ventilation opening; 9—fan; 10—radiating mechanism; 11—semiconductor refrigeration sheet; 12—control circuit board; and 13—heat conducting silica gel sheet.

DETAILED DESCRIPTION OF THE EMBODIMENTS

The technical solution of the present patent is further described in detail below with reference to specific implementation manners.

Embodiments of the present patent are described in detail below, and examples of the embodiments are illustrated in the accompanying drawings. The same or similar reference numerals are used to refer to the same or similar elements or elements having the same or similar functions. The embodiments described below with reference to the accompanying drawings are merely intended to explain the present invention rather than limiting the present patent.

In the description of the present patent, it is to be understood that orientations or positional relationships indicated by the terms "center", "upper", "lower", "front", "back", "left", "right", "vertical", "horizontal", "top", "bottom", "inside", "outside", and the like are the orientations or positional relationships shown on the basis of the accompanying drawings, and are merely for facilitating describing the present patent and simplifying the description, rather than indicating or implying that the devices or elements must have particular orientations, and be constructed and operated in particular orientations. Thus, it cannot be construed as a limitation to the present patent.

In the description of the present patent, it is to be noted that, unless otherwise specified and defined explicitly, the terms "mounted", "interconnected", "connected", and "arranged" are to be interpreted broadly, may be, for example, fixedly connected or arranged, or detachably connected or arranged, or integrally connected or arranged. Those of ordinary skill in the art may understand specific meanings of the above-mentioned terms in the present patent according to specific cases.

Embodiment 1

Figure 2:
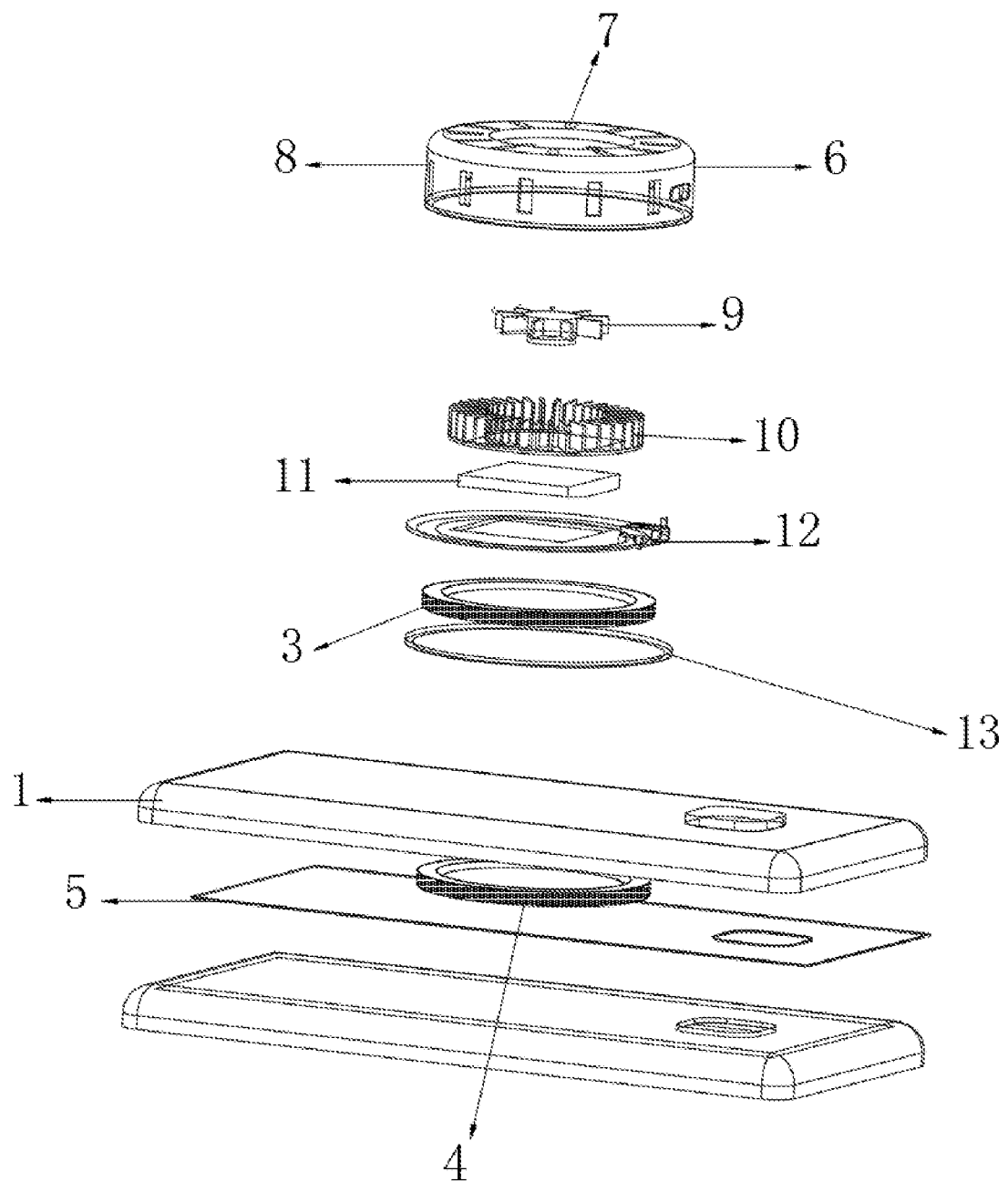
FIG. 2 is an exploded schematic structural diagram of the split mobile phone radiator provided by the present disclosure.

Refer to FIG. 1 to FIG. 2, a split mobile phone radiator includes a protective cover 1. An accommodating groove is formed in the top of the inner wall of the protective cover 1. A refrigeration module 2 is separably arranged on the top surface, far away from the accommodating groove, of the protective cover 1. The refrigeration module 2 includes a semiconductor refrigeration mechanism, a radiating mechanism 10 used for cooling the semiconductor refrigeration mechanism, and a rear cover 6 wrapping around the semiconductor refrigeration mechanism and the radiating mechanism 10. A heat conducting silica gel sheet 13 is arranged on one side, close to the protective cover 1, of the rear cover 6. The heat conducting silica gel sheet 13 can achieve anti-skidding performance when the refrigeration module 2 is connected to the protective cover 1. The refrigeration module 2 and the protective cover 1 are of a separable type, so that the whole mobile phone radiator can be directly attached to the back side of the mobile phone, has a good separable function, has a detachable function, and facilitates carrying lightly and conveniently. Moreover, the surface of the refrigeration module 2 and the protective cover 1 are smooth, so that the refrigeration module 2 can be completely attached to the top of the protective cover 1.

First ventilation openings 7 are formed in the top of the rear cover 6, and second ventilation openings 8 are formed between an outer wall and an inner wall of the circumference of the rear cover 6. In some embodiments of the present disclosure, the first ventilation openings 7 and the second ventilation openings 8 are uniformly distributed.

The semiconductor refrigeration mechanism includes a semiconductor refrigeration sheet 11 and a control circuit board 12. A through hole for the semiconductor refrigeration sheet 11 to penetrate through is formed in the control circuit board 12. The control circuit board 12 internally includes a control circuit for driving the semiconductor refrigeration sheet 11. The semiconductor refrigeration sheet 11 is electrically connected to the control circuit board 12. A hollow area is formed between the through hole through which the semiconductor refrigeration sheet 11 penetrates and the top of the protective cover 1. The semiconductor refrigeration sheet 11 is made of a square, rectangular, circular, or elliptical refrigeration material, so that the refrigeration material is adapted to the mobile phone. One side of the semiconductor refrigeration sheet 11 faces a rear cover of the mobile phone for refrigerating, and the other side faces the radiating mechanism 10 for radiating.

The radiating mechanism 10 includes a radiating sheet and a plurality of radiating fins that are distributed annularly. One side surface of the radiating sheet is connected to the plurality of radiating fins, and the other side surface of the radiating sheet is tightly attached to a heating surface of the semiconductor refrigeration sheet 11 to realize radiating. A fan 9 is arranged on the inner side of a ring of the plurality of radiating fins. The fan 9 rotates in the ring to enhance radiating. The control circuit board 12 further includes a driving circuit used for driving the fan 9. The fan 9 is electrically connected to the control circuit board 12. The surface of the radiating mechanism 10 is coated with a radiating coating.

Figure 3:
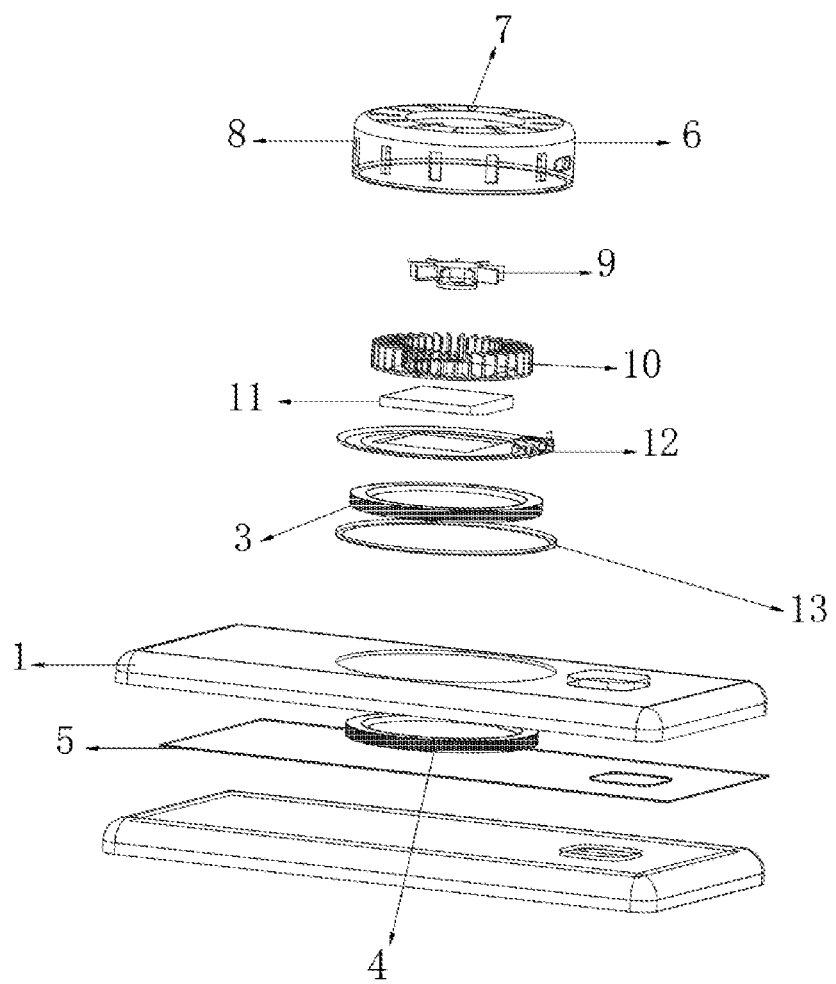
FIG. 3 is an exploded schematic structural diagram of another implementation manner of the split mobile phone radiator provided by the present disclosure.

A heat conducting sheet 5 is arranged in the accommodating groove, or as shown in FIG. 3, a through hole adapted to the refrigeration module 2 is formed in one side, far away from the accommodating groove, of the protective cover 1. Heat can be conducted out better when the refrigeration module 2 directly penetrates through the through hole to be in contact with the mobile phone placed in the accommodating groove.

The heat conducting sheet 5 is coated or bonded in the accommodating groove of the protective cover 1. The area of the heat conducting sheet 5 exceeds the contact area of the refrigeration module 2 and the heat conducting sheet 5. The heat conducting sheet 5 is made of a heat conducting silica gel material, or a heat conducting plastic material, or a heat conducting graphene material. A hole is formed in the protective cover 1. The heat conducting sheet 5 is in contact with the refrigeration module 2. The power supply of the refrigeration module 2 may adopt external direct current power supply or built-in battery power supply. A camera hole, an audio hole position, and a charging hole position that are adapted to the mobile phone are formed in one side of the top of the protective cover 1 and the one side of the top of the heat conducting sheet 5.

The refrigeration module 2 is fixed to the protective cover 1 by using bonding force, and a bonding layer is arranged between the rear cover 6 and the protective cover 1.

The protective cover 1 is made of a heat conducting material, which includes, but is not limited to, a heat conducting metal and a heat conducting polymer.

Working principle: when in use, a user tightly clamps the mobile phone inside the protective cover 1, so that parts on the mobile phone are clamped inside the camera hole, the audio hole position, the charging hole position, etc., and the separable effect between the refrigeration module 2 and the protective cover 1 can be realized in a bonding manner. Therefore, the whole mobile phone radiator can be directly attached to the back side of the mobile phone, so that the mobile phone has a good split function and a goof detachable function. The heat conducting sheet 5 first the mobile phone with certain pressure by using the protective cover 1, which facilitates heat conducting of the heating part of the mobile phone and the heat conducting sheet 5. The heat conducting silica gel sheet 13 and the heat conducting sheet 5 are cooled through a refrigerating surface of the semiconductor refrigeration sheet 11, so as to reduce the temperature of the mobile phone. In addition, a heating surface of the semiconductor refrigeration sheet 11 is radiated through the radiating mechanism 10, which can effectively discharge the heat generated by the semiconductor refrigeration sheet 11 from the back of the mobile phone, so as to realize a radiating function of the whole split mobile phone radiator. In addition, the protective cover 1 is made of a heat conducting material, which can surface improve heat transfer. On one hand, the protective cover 1 transfers heat by itself, and on the other hand, the protective cover 1 is combined with the refrigeration module 2 for transferring heat, so as to further improve a cooling function of the radiator.

Embodiment 2

A split mobile phone radiator, compared with Embodiment 1, the refrigeration module 2 is fixed to the protective cover 1 in a buckling manner. A buckle structure is arranged between the bottom of the rear cover 6 and the top of the protective cover 1.

Working principle: a separable effect between the refrigeration module 2 and the protective cover 1 may be achieved in a buckling fixing manner.

Embodiment 3

A split mobile phone radiator, compared with Embodiment 1, the refrigeration module 2 is fixed to the protective cover 1 by using magnetic attraction force. A first magnetic ring 3 is arranged at the bottom of an inner wall of the rear cover 6. If there is no magnetic ring in mobile phone, a second magnetic ring 4 that attracts the first magnetic ring 3 mutually is embedded into the protective cover 1.

Working principle: separability of the refrigeration module 2 is realized through the magnetic attraction force of the first magnetic ring 3 and the second magnetic ring 4.

Embodiment 4

A split mobile phone radiator, compared with Embodiment 1, the refrigeration module 2 is fixed to the protective cover 1 by using magnetic attraction force. A first magnetic ring 3 is arranged at the bottom of an inner wall of the rear cover 6. If there is a magnetic ring in a mobile phone, the magnetic ring in the mobile phone attracts the first magnetic ring 3 mutually.

Working principle: separability of the refrigeration module 2 is realized through the magnetic attraction force of the first magnetic ring 3 and the mobile phone with a built-in magnetic ring.

The foregoing descriptions are merely better specific implementation manners of the present disclosure, but the scope of protection of the present disclosure is not limited thereto. Equivalent replacement or change made by any person skilled in the art in the technical range disclosed by the present disclosure according to the technical solution of the present disclosure and the present disclosure concept thereof shall fall within the protection scope of the present disclosure.

What is claimed is:

1. A split mobile phone radiator, comprising a protective cover (1), wherein an accommodating groove is formed in the top of the inner wall of the protective cover (1); a refrigeration module (2) is separably arranged on the top surface, far away from the accommodating groove, of the protective cover (1); the refrigeration module (2) comprises a semiconductor refrigeration mechanism, a radiating mechanism (10) used for cooling the semiconductor refrigeration mechanism, and a rear cover (6) wrapping around the semiconductor refrigeration mechanism and the radiating mechanism (10); and a heat conducting silica gel sheet (13) is arranged on one side, close to the protective cover (1), of the rear cover (6).

2. The split mobile phone radiator according to claim 1, wherein first ventilation openings (7) are formed in the top of the rear cover (6), and second ventilation openings (8) are formed between an outer wall and an inner wall of the circumference of the rear cover (6).

3. The split mobile phone radiator according to claim 1, wherein the semiconductor refrigeration mechanism comprises a semiconductor refrigeration sheet (11) and a control circuit board (12); a through hole for the semiconductor refrigeration sheet (11) to penetrate through is formed in the control circuit board (12); the control circuit board (12) internally comprises a control circuit for driving the semiconductor refrigeration sheet (11); and the semiconductor refrigeration sheet (11) is electrically connected to the control circuit board (12).

4. The split mobile phone radiator according to claim 1, wherein the radiating mechanism (10) comprises a radiating sheet and a plurality of radiating fins that are distributed annularly; one side surface of the radiating sheet is connected to the plurality of radiating fins, and the other side surface of the radiating sheet is tightly attached to a heating surface of the semiconductor refrigeration sheet (11); a fan (9) is arranged on the inner side of a ring of the plurality of radiating fins; the control circuit board (12) further comprises a driving circuit used for driving the fan (9); the fan (9) is electrically connected to the control circuit board (12); and the surface of the radiating mechanism (10) is coated with a radiating coating.

5. The split mobile phone radiator according to claim 1, wherein a heat conducting sheet (5) is arranged in the accommodating groove.

6. The split mobile phone radiator according to claim 1, wherein a through hole adapted to the refrigeration module (2) is formed in one side, far away from the accommodating groove, of the protective cover (1).

7. The split mobile phone radiator according to claim 1, wherein the protective cover (1) is made of a heat conducting material.

8. The split mobile phone radiator according to claim 1, wherein the refrigeration module (2) is fixed to the protective cover (1) by using bonding force; and a bonding layer is arranged between the rear cover (6) and the protective cover (1).

9. The split mobile phone radiator according to claim 1, wherein the refrigeration module (2) is fixed to the protective cover (1) in a buckling manner; and a buckle structure is arranged between the bottom of the rear cover (6) and the top of the protective cover (1).

10. The split mobile phone radiator according to claim 1, wherein the refrigeration module (2) is fixed to the protective cover (1) by using magnetic attraction force; a first magnetic ring (3) is arranged at the bottom of an inner wall of the rear cover (6); and if there is no magnetic ring in a mobile phone, a second magnetic ring (4) that attracts the first magnetic ring (3) mutually is embedded into the protective cover (1).

11. The split mobile phone radiator according to claim 1, wherein the refrigeration module (2) is fixed to the protective cover (1) by using magnetic attraction force; a first magnetic ring (3) is arranged at the bottom of an inner wall of the rear cover (6); and if there is a magnetic ring in a mobile phone, the magnetic ring in the mobile phone attracts the first magnetic ring (3) mutually.

\* \* \* \* \*